United States Patent [19]

Liu

[11] Patent Number: 5,460,998
[45] Date of Patent: Oct. 24, 1995

[54] INTEGRATED P+ IMPLANT SEQUENCE IN DPDM PROCESS FOR SUPPRESSION OF GIDL

[75] Inventor: Chweng-Ming Liu, Poughkeekpsie, N.Y.

[73] Assignee: Taiwan Semiconductor Manufacturing Company, Hsinchu, Taiwan

[21] Appl. No.: 405,720

[22] Filed: Mar. 17, 1995

[51] Int. Cl.$^6$ ............................................... H01L 21/8238
[52] U.S. Cl. .............................. 437/57; 437/34; 437/44
[58] Field of Search ................................ 437/29, 30, 34, 437/44, 57

[56] References Cited

U.S. PATENT DOCUMENTS

| | | | |
|---|---|---|---|
| 4,760,033 | 7/1988 | Mueller | 437/34 |
| 5,091,763 | 2/1992 | Sanchez | 357/23.9 |
| 5,183,771 | 2/1993 | Mitsui et al. | 437/44 |
| 5,405,791 | 4/1995 | Ahmad et al. | 437/57 |

OTHER PUBLICATIONS

"Design for Suppression of Gate–Induced Drain Leakage in LDD MOSFET's Using a Quasi–Two–Dimensional Analytical Model", by Parke et al., IEEE Transactions on Electron Devices, vol. 39, No. 7, Jul. 1992, pp. 1694–1702.

*Primary Examiner*—Chandra Chaudhari
*Attorney, Agent, or Firm*—George O. Saile; Rosemary L. S. Pike

[57] ABSTRACT

A new method of integrating different width spacers into a multiple polysilicon process in the fabrication of an integrated circuit is described. A semiconductor substrate is provided wherein NMOS and PMOS regions are separated by an isolation region. Gate electrodes are formed in the NMOS and PMOS regions. Lightly doped NMOS and PMOS regions are implanted into the semiconductor substrate. A dielectric layer is deposited over the gate electrodes in the NMOS and PMOS regions and etched away to leave sidewall spacers on the gate electrodes. The PMOS region is covered with a mask. Heavily doped NMOS source and drain regions are implanted into the semiconductor substrate, then the photoresist mask is removed. Thereafter, an interpoly oxide layer is deposited overlying the gate electrodes in the NMOS and PMOS regions. A contact opening is formed through the interpoly oxide layer to the gate electrodes within the NMOS region. A layer of polysilicon is deposited overlying the interpoly oxide layer and within the contact opening and patterned wherein the polysilicon layer within the PMOS region is removed. The NMOS region is covered with a photoresist mask. The interpoly oxide layer not covered by the mask is etched away to leave a second set of spacers on the sidewalls of the gate electrodes within the PMOS region. Heavily doped PMOS source and drain regions are implanted into the semiconductor substrate and the photoresist mask is removed. The fabrication of the integrated circuit may now be completed.

33 Claims, 3 Drawing Sheets

INTEGRATED P+ IMPLANT SEQUENCE IN DPDM PROCESS FOR SUPPRESSION OF GIDL

BACKGROUND OF THE INVENTION

(1) Field of the Invention

The invention relates to the fabrication of integrated circuit devices, and more particularly, to a method of integrating different width spacers for the P and N areas into the double or more polysilicon process in the manufacture of integrated circuits.

(2) Description of the Prior Art

In the manufacture of integrated circuits, as device sizes are scaled down, the gate oxide and spacer layers become thinner. As a result, gate induced drain leakage (GIDL) becomes a significant problem. In their article, "Design for Suppression of Gate-Induced Drain Leakage in LDD MOSFET's Using a Quasi-Two-Dimensional Analytical Model," by Parke et al, *IEEE Transactions on Electron Devices*, Vol. 39, No. 7, July, 1992, pp. 1694–1702, the authors explain that the closer the N+ region is to the gate edge, the higher the vertical electrical field which enhances band-to-band tunneling in the device, hence causing gate induced drain leakage. The behaviors of N+ and P+ are different. Lateral diffusion of PMOS is much more significant than that of NMOS with the result that the P+ edge is much closer to the gate than is the N+ edge, when one spacer width is used for both NMOS and PMOS.

FIG. 1 illustrates a partially completed integrated circuit device formed on a semiconductor substrate 10. The N− and N+ regions are formed within the NMOS portion 12 and P− and P+ regions are formed within the PMOS portion 14 of the semiconductor substrate prior to the deposition of the interpoly oxide layer 25 in the conventional process of the prior art.

FIG. 2 shows a close-up view of the gate edge in the PMOS region. The sharp corner 9 of the gate easily creates a high electric field. FIG. 3 illustrates the drain current versus the drain voltage 31 for a pure junction. Line 33 shows the drain current versus the drain voltage for a junction such as 13 in FIG. 2 which is close to the sharp gate edge. Gate induced drain leakage 35 is observed for this junction.

U.S. Pat. No. 4,760,033 to Mueller teaches a process of using different N and P MOS spacer widths for reducing the under-diffusion of the implanted source-drain regions under the gate areas. U.S. Pat. No. 5,091,763 to Sanchez discloses the use of a conductive spacer coupled with a thin oxide spacer in order to form self-aligned source and drain regions.

SUMMARY OF THE INVENTION

A principal object of the present invention is to provide an effective and very manufacturable method of integrating the formation of different width spacers for NMOS and PMOS into the multiple polysilicon process for fabricating integrated circuits.

Another object of the invention is to provide a method for integrating the formation of different width spacers for NMOS and PMOS into the multiple polysilicon process for fabricating integrated circuits which will result in reduced gate induced drain leakage.

In accordance with the objects of this invention a method of integrating different width spacers into a multiple polysilicon process in the fabrication of an integrated circuit is described. A semiconductor substrate is provided wherein NMOS and PMOS regions are separated by an isolation region. Gate electrodes are formed in the NMOS and PMOS regions. Lightly doped regions are implanted into the semiconductor substrate within the NMOS and PMOS regions. A dielectric layer is deposited over the gate electrodes in the NMOS and PMOS regions and etched away to leave spacers on the sidewalls of the gate electrodes. The PMOS region is covered with a photoresist mask. Heavily doped source and drain regions are implanted into the semiconductor substrate within the NMOS region, then the photoresist mask is removed. Thereafter, an interpoly oxide layer is deposited overlying the gate electrodes in the NMOS and PMOS regions. A contact opening is formed through the interpoly oxide layer to the gate electrodes within the NMOS region. A layer of polysilicon is deposited overlying the interpoly oxide layer and within the contact opening and patterned wherein the polysilicon layer within the PMOS region is removed. The NMOS region is covered with a photoresist mask. The interpoly oxide layer not covered by the photoresist mask is etched away to leave a second set of spacers on the sidewalls of the gate electrodes within the PMOS region. Heavily doped source and drain regions are implanted into the semiconductor substrate within the PMOS region and the photoresist mask is removed. Thereafter, an interlayer dielectric layer is deposited overlying the gate electrodes. The fabrication of the integrated circuit may now be completed.

BRIEF DESCRIPTION OF THE DRAWINGS

In the accompanying drawings forming a material part of this description, there is shown.

DESCRIPTION OF THE PREFERRED EMBODIMENTS

Figure 4:
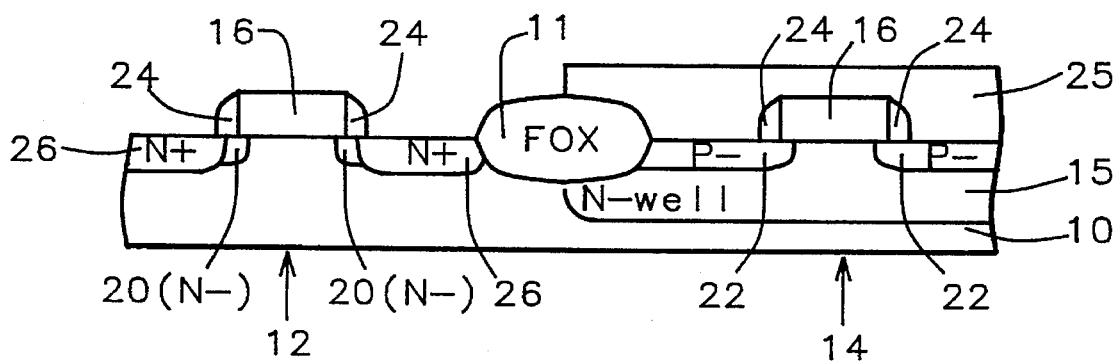
FIGS. 4, 5A, and 6 schematically illustrate in cross-sectional representation one preferred embodiment of the present invention.

Referring now more particularly to FIG. 4, there is shown an illustration of a portion of a partially completed integrated circuit. The first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, field oxide region 11 is formed to isolate the NMOS region 12 from the PMOS region 14. The semiconductor substrate may have a P-dopant concentration. An N-well 15 is formed within the PMOS region 14, as is conventional in the art.

Gate electrodes are formed as is conventional in the art. The surface of the silicon substrate 10 is thermally oxidized to form the gate oxide layer (not shown). The polysilicon layer 16 is deposited, as by low pressure chemical vapor deposition (LPCVD). The polysilicon layer is etched as is conventional in the art to provide a desired pattern of gate electrodes within the NMOS 12 and PMOS 14 regions as seen in FIG. 4.

The source/drain structure of the MOS FET may now be formed by the following steps. First, the lightly doped source and drain implantations of N− and P− dopants are performed. Lithographic masks may be required to protect the areas not to be subjected to the particular N− or P− ion implantation. The formation of the lithographic masks is done by conventional lithography and etching techniques. The N− lightly doped drain implantation 20 is done with, for example, phosphorus at a dose of between about 1 E 13 to 6 E 13 atoms/cm$^2$ and with an energy of between about 30 to 70 KeV. The P− lightly doped drain implantation 22 is done with, for example, $BF_2$ at a dose of between about 1 E 13 to 1 E 14 atoms/cm$^2$ and with an energy of between about 30 to 80 KeV.

The dielectric spacer 24 is now to be formed followed by the completion of the lightly doped drain source/drain structures. The deposition of the spacer dielectric film is an LPCVD deposition of tetraethoxysilane (TEOS) oxide at between about 700° to 720° C. to a thickness of between about 1000 to 3000 Angstroms.

An anisotropic etching of this layer produces the dielectric spacer layer 24 on the sidewalls of the gate electrodes 16. The spacer width may be between about 600 to 2400 Angstroms to optimize the NMOS implantation.

Now the NMOS source and drain structures will be completed. In the present invention, the PMOS source and drain implantation will be done later in the process. The NMOS implantation can be optimized first with the width of spacer 24. The PMOS implantation will be done later with an additional spacer width to optimize that implantation.

The PMOS region 14 is covered by a photoresist mask 25. The N+ heavily doped source and drain implantation 26 is done with, for example, arsenic at a dose of between about 2 E 15 to 5 E 15 atoms/cm$^2$ and with an energy of between about 10 to 80 KeV. The photoresist mask 25 is removed.

Figure 5A:
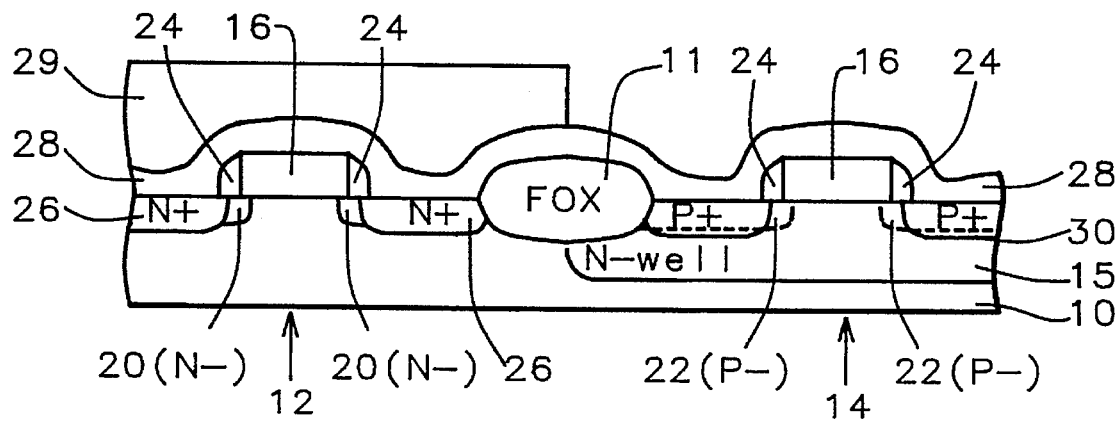

Next, an interpoly oxide layer 28 is deposited overlying the gate electrode and source and drain structures in both the NMOS and PMOS regions 12 and 14, as shown in FIG. 5A. This is an LPCVD deposition of TEOS oxide with a thickness of between about 500 to 2000 Angstroms.

Next, a photoresist mask 29 is placed over the NMOS region 12. The interpoly oxide layer 28 is etched away where it is not covered by the mask to form a second set of spacers on the sidewalls of the gate electrodes in the PMOS region 14. These spacers 28 may have a width of between about 300 to 1500 Angstroms to optimize the PMOS implantation. Then, the P+ heavily doped source and drain implantation 30 is done with, for example, $BF_2$ or boron ions at a dose of between about 1 E 15 to 5 E 15 atoms/cm$^2$ and with an energy of between about 30 to 60 KeV for $BF_2$ or between about 10 to 30 KeV for boron. The photoresist mask 29 is removed.

Figure 5B:
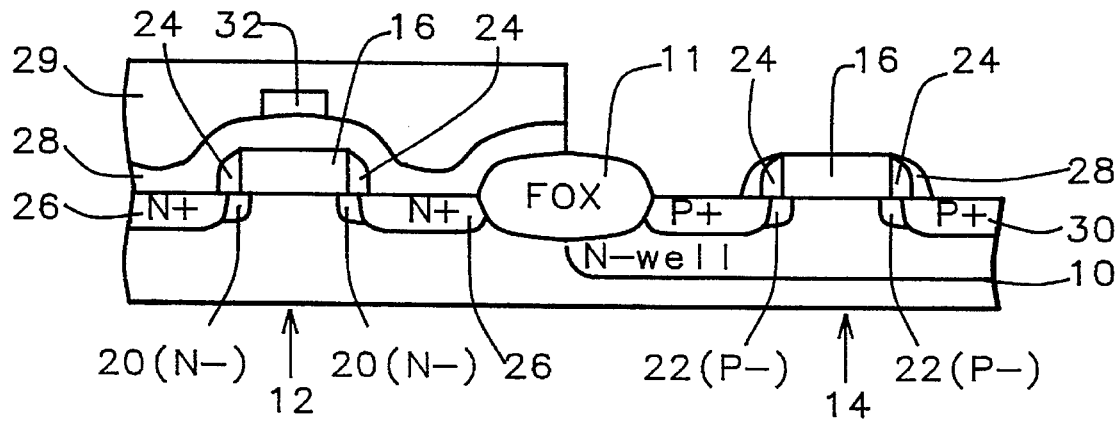
FIG. 5B schematically illustrates in cross-sectional representation a second preferred embodiment of the present invention.

In a more preferred embodiment of the present invention, before the interpoly oxide layer 28 is etched to form spacers in the PMOS area 14, a contact to the gate electrode in the NMOS region 12 is defined. A layer of polysilicon is deposited over the entire surface of the substrate and then patterned to leave the polysilicon contact 32 in the NMOS region, as illustrated in FIG. 5B. All of the polysilicon layer in the PMOS region 14 is removed.

At this point, processing continues as for the first embodiment. Photoresist mask 29 is placed over the NMOS region 12. The interpoly oxide layer 28 is etched away where it is not covered by the mask to form a second set of spacers on the sidewalls of the gate electrodes in the PMOS region 14. Then, the P+ heavily doped source and drain implantation 30 is performed, as described above, and the photoresist mask 29 is removed.

In the process of the first embodiment, the polysilicon contact is defined and the polysilicon layer deposited and patterned to leave polysilicon contact 32 in the NMOS region 12 after the P+ implantation.

Next, an interlayer dielectric layer is deposited over the surface of the substrate (not shown). This may be a combination of borophosphosilicate glass (BPSG) and TEOS oxide, or the like. The high temperature processing used in this step serves to drive in the N−, N+, P−, and P+ regions. The integrated circuit is completed as is conventional in the art.

Figure 1:
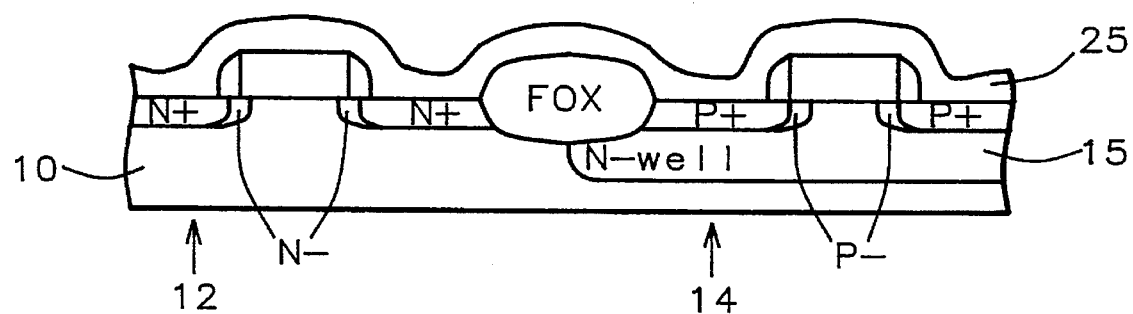
FIGS. 1 and 2 schematically illustrate in cross-sectional representation an embodiment of the prior art.
Figure 2:
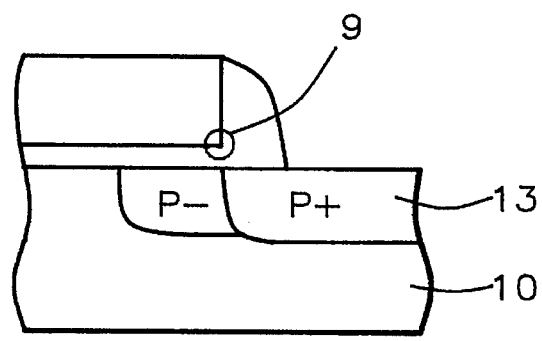
Figure 3:
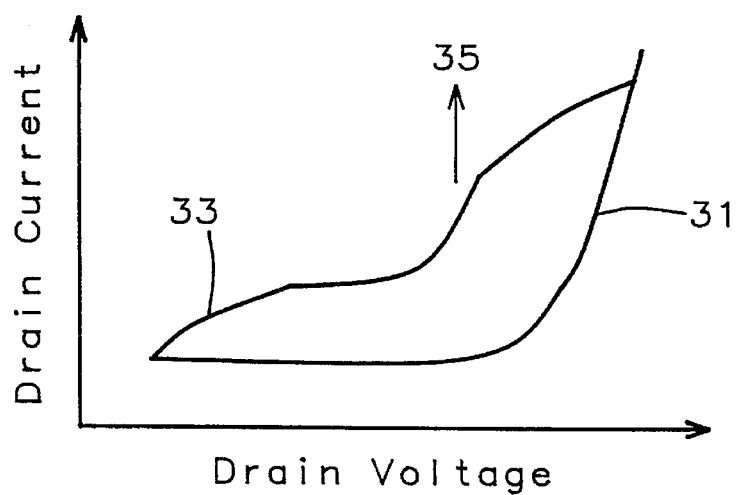
FIG. 3 graphically illustrates the relationship between drain current and drain voltage of an integrated circuit device.
Figure 6:
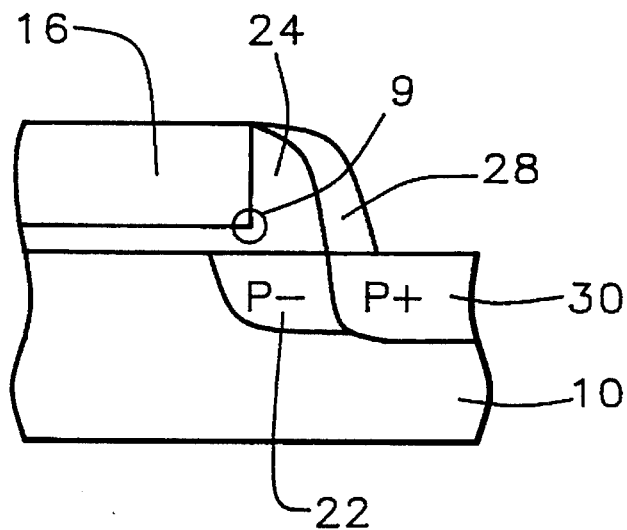

FIG. 6 shows a close-up view of the gate edge in the PMOS region. The sharp corner 9 of the gate easily creates a high electric field. However, unlike the junction 13 in FIG. 2, the junction 30 of the present invention is separated from the sharp corner of the gate edge 9. Therefore, the gate induced drain leakage will be small. The widths of the two spacers 24 and 28 are critical for modulating the distance between the source/drain edge and the gate edge. The process of the present invention provides the degree of freedom to optimize both the NMOS and PMOS junction positioning.

Figure 7:
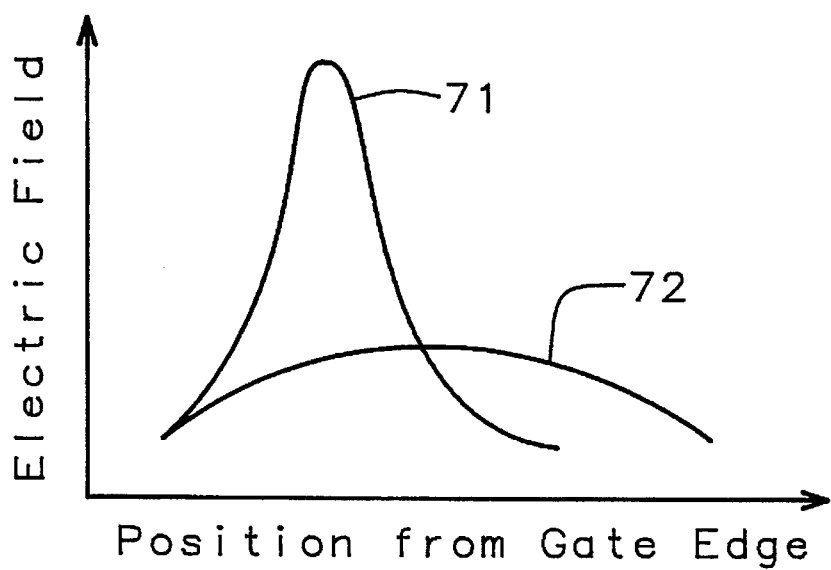
FIG. 7 graphically illustrates the relationship between the vertical electric field and the position of the junction from the gate edge.

Referring now to FIG. 7, there is shown the vertical electric field as a function of the position of the P+ region from the gate edge. The vertical electric field is high when only a single spacer 24 is used, as shown in line 71. However, the electric field can be reduced to that shown by line 72 when both spacers 24 and 28 are used. The higher the vertical electric field, the more severe the tunneling. The larger the spacer width, the more the source/drain junction edge is separated from the gate edge, and hence, the lower the vertical electric field or tunneling current.

The process of the invention can be used in any double (or more) polysilicon process for making such integrated circuit devices as DRAM, SRAM, EPROM, or the like.

While the invention has been particularly shown and described with reference to the preferred embodiments thereof, it will be understood by those skilled in the art that various changes in form and details may be made without departing from the spirit and scope of the invention.

What is claimed is:

1. A method of integrating different width spacers into a multiple polysilicon process in the fabrication of an integrated circuit comprising:

providing a semiconductor substrate wherein NMOS and PMOS regions are separated by an isolation region;

forming gate electrodes in said NMOS and PMOS regions;

implanting lightly doped regions into said semiconductor substrate within said NMOS and PMOS regions;

depositing a dielectric layer over said gate electrodes in said NMOS and PMOS regions and etching away said dielectric layer to leave a first set of spacers on the sidewalls of said gate electrodes;

covering said PMOS region with a first photoresist mask;

implanting heavily doped source and drain regions into said semiconductor substrate within said NMOS region;

removing said first photoresist mask;

thereafter depositing an interpoly oxide layer overlying said gate electrodes in said NMOS and PMOS regions;

forming a contact opening through said interpoly oxide layer to said gate electrodes within said NMOS regions;

depositing a layer of polysilicon overlying said interpoly oxide layer and within said contact opening and patterning said polysilicon layer wherein said polysilicon layer within said PMOS region is removed;

covering said NMOS region with a second photoresist mask;

thereafter etching away said interpoly oxide layer not covered by said second photoresist mask to leave a second set of spacers on the sidewalls of said gate electrode within said PMOS region;

implanting heavily doped source and drain regions into said semiconductor substrate within said PMOS region;

removing said second photoresist mask;

thereafter depositing an interlayer dielectric layer overlying said gate electrodes; and completing the fabrication of said integrated circuit.

2. A method according to claim 1 wherein said gate electrodes are composed of polysilicon.

3. A method according to claim 1 wherein said lightly doped regions within said NMOS regions are formed by implanting phosphorus ions with a dosage of between about 1 E 13 to 6 E 13 atoms/cm$^2$ at an energy of between about 30 to 70 KeV.

4. A method according to claim 1 wherein said lightly doped regions within said PMOS regions are formed by implanting $BF_2$ ions with a dosage of between about 1 E 13 to 1 E 14 atoms/cm$^2$ at an energy of between about 30 to 80 KeV.

5. A method according to claim 1 wherein said dielectric layer comprises low temperature oxide and is deposited by low pressure chemical vapor deposition to a thickness of between about 1000 to 3000 Angstroms.

6. A method according to claim 1 wherein said first set of spacers has a width of between about 600 to 2400 Angstroms.

7. A method according to claim 1 wherein said heavily doped regions within said NMOS regions are formed by implanting arsenic ions with a dosage of between about 2 E 15 to 5 E 15 atoms/cm$^2$ at an energy of between about 10 to 80 KeV.

8. A method according to claim 1 wherein said interpoly oxide layer comprises low temperature oxide and is deposited by low pressure chemical vapor deposition to a thickness of between about 500 to 2000 Angstroms.

9. A method according to claim 1 wherein said second set of spacers has a width of between about 300 to 1500 Angstroms.

10. A method according to claim 1 wherein said heavily doped regions within said PMOS regions are formed by implanting $BF_2$ ions with a dosage of between about 1 E 15 to 5 E 15 atoms/cm$^2$ at an energy of between about 30 to 60 KeV.

11. A method according to claim 1 wherein said heavily doped regions within said PMOS regions are formed by implanting boron ions with a dosage of between about 1 E 15 to 5 E 15 atoms/cm$^2$ at an energy of between about 10 to 30 KeV.

12. A method of integrating different width spacers into a multiple polysilicon process in the fabrication of an integrated circuit comprising:

providing a semiconductor substrate wherein NMOS and PMOS regions are separated by an isolation region;

forming gate electrodes in said NMOS and PMOS regions;

implanting lightly doped regions into said semiconductor substrate within said NMOS and PMOS regions;

depositing a dielectric layer over said gate electrodes in said NMOS and PMOS regions and etching away said dielectric layer to leave spacers on the sidewalls of said gate electrodes;

covering said PMOS region with a first photoresist mask;

implanting heavily doped source and drain regions into said semiconductor substrate within said NMOS region;

removing said first photoresist mask;

thereafter depositing an interpoly oxide layer overlying said gate electrodes in said NMOS and PMOS regions;

covering said NMOS region with a second photoresist mask;

etching away said interpoly oxide layer not covered by said second photoresist mask to leave a second set of spacers on the sidewalls of said gate electrode within said PMOS region;

implanting heavily doped source and drain regions into said semiconductor substrate within said PMOS region;

removing said second photoresist mask;

thereafter forming a contact opening through said interpoly oxide layer to said gate electrodes within said NMOS regions;

depositing a layer of polysilicon overlying said interpoly oxide layer and within said contact opening and patterning said polysilicon layer wherein said polysilicon layer within said PMOS region is removed;

thereafter depositing an interlayer dielectric layer overlying said gate electrodes; and completing the fabrication of said integrated circuit.

13. A method according to claim 12 wherein said gate electrodes are composed of polysilicon.

14. A method according to claim 12 wherein said lightly doped regions within said NMOS regions are formed by implanting phosphorus ions with a dosage of between about 1 E 13 to 6 E 13 atoms/cm$^2$ at an energy of between about 30 to 70 KeV.

15. A method according to claim 12 wherein said lightly doped regions within said PMOS regions are formed by implanting $BF_2$ ions with a dosage of between about 1 E 13 to 1 E 14 atoms/cm$^2$ at an energy of between about 30 to 80 KeV.

16. A method according to claim 12 wherein said dielectric layer comprises low temperature oxide and is deposited by low pressure chemical vapor deposition to a thickness of between about 1000 to 3000 Angstroms.

17. A method according to claim 12 wherein said first set of spacers has a width of between about 600 to 2400 Angstroms.

18. A method according to claim 12 wherein said heavily doped regions within said NMOS regions are formed by implanting arsenic ions with a dosage of between about 2 E 15 to 5 E 15 atoms/cm$^2$ at an energy of between about 10 to 80 KeV.

19. A method according to claim 12 wherein said interpoly oxide layer comprises low temperature oxide and is deposited by low pressure chemical vapor deposition to a thickness of between about 500 to 2000 Angstroms.

20. A method according to claim 12 wherein said second set of spacers has a width of between about 300 to 1500 Angstroms.

21. A method according to claim 12 wherein said heavily doped regions within said PMOS regions are formed by implanting $BF_2$ ions with a dosage of between about 1 E 15 to 5 E 15 atoms/cm$^2$ at an energy of between about 30 to 60 KeV.

22. A method according to claim 12 wherein said heavily doped regions within said PMOS regions are formed by implanting boron ions with a dosage of between about 1 E 15 to 5 E 15 atoms/cm$^2$ at an energy of between about 10 to 30 KeV.

23. A method of integrating different width spacers into a multiple polysilicon process in the fabrication of an integrated circuit comprising:

providing a semiconductor substrate wherein NMOS and PMOS regions are separated by an isolation region;

providing a gate oxide layer over the surface of said semiconductor substrate;

depositing a first layer of polysilicon overlying said gate oxide layer and patterning said first polysilicon layer to form gate electrodes in said NMOS and PMOS regions;

implanting lightly doped regions into said semiconductor substrate within said NMOS and PMOS regions;

depositing a dielectric layer over said gate electrodes in said NMOS and PMOS regions and etching away said dielectric layer to leave a first set of spacers on the sidewalls of said gate electrodes;

covering said PMOS region with a first photoresist mask;

implanting heavily doped source and drain regions into said semiconductor substrate within said NMOS region;

removing said first photoresist mask;

thereafter depositing an interpoly oxide layer overlying said gate electrodes in said NMOS and PMOS regions;

forming a contact opening through said interpoly oxide layer to said gate electrodes within said NMOS regions;

depositing a second layer of polysilicon overlying said interpoly oxide layer and within said contact opening and patterning said second polysilicon layer wherein said second polysilicon layer within said PMOS region is removed;

covering said NMOS region with a second photoresist mask;

etching away said interpoly oxide layer not covered by said second photoresist mask to leave a second set of spacers on the sidewalls of said gate electrode within said PMOS region;

implanting heavily doped source and drain regions into said semiconductor substrate within said PMOS region;

removing said second photoresist mask;

thereafter depositing an interlayer dielectric layer overlying said gate electrodes; and completing the fabrication of said integrated circuit.

24. A method according to claim 23 wherein said lightly doped regions within said NMOS regions are formed by implanting phosphorus ions with a dosage of between about 1 E 13 to 6 E 13 atoms/cm$^2$ at an energy of between about 30 to 70 KeV.

25. A method according to claim 23 wherein said lightly doped regions within said PMOS regions are formed by implanting $BF_2$ ions with a dosage of between about 1 E 13 to 1 E 14 atoms/cm$^2$ at an energy of between about 30 to 80 KeV.

26. A method according to claim 23 wherein said first set of spacers has a width of between about 600 to 2400 Angstroms.

27. A method according to claim 23 wherein said heavily doped regions within said NMOS regions are formed by implanting arsenic ions with a dosage of between about 2 E 15 to 5 E 15 atoms/cm$^2$ at an energy of between about 10 to 80 KeV.

28. A method according to claim 23 wherein said second set of spacers has a width of between about 300 to 1500 Angstroms.

29. A method according to claim 23 wherein said heavily doped regions within said PMOS regions are formed by implanting $BF_2$ ions with a dosage of between about 1 E 15 to 5 E 15 atoms/cm$^2$ at an energy of between about 30 to 60 KeV.

30. A method according to claim 23 wherein said heavily doped regions within said PMOS regions are formed by implanting boron ions with a dosage of between about 1 E 15 to 5 E 15 atoms/cm$^2$ at an energy of between about 10 to 30 KeV.

31. A method according to claim 23 wherein said integrated circuit is a DRAM device.

32. A method according to claim 23 wherein said integrated circuit is an SRAM device.

33. A method according to claim 23 wherein said integrated circuit is an EPROM device.

\* \* \* \* \*